US009741818B2

(12) United States Patent
Liu et al.

(10) Patent No.: US 9,741,818 B2
(45) Date of Patent: Aug. 22, 2017

(54) MANUFACTURING METHOD OF SEMICONDUCTOR STRUCTURE FOR IMPROVING QUALITY OF EPITAXIAL LAYERS

(71) Applicant: UNITED MICROELECTRONICS CORP., Hsin-Chu (TW)

(72) Inventors: Chueh-Yang Liu, Tainan (TW); Yu-Ying Lin, Tainan (TW); I-cheng Hu, Kaohsiung (TW); Tien-I Wu, Taoyuan (TW); Yu-Shu Lin, Pingtung County (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/964,546

(22) Filed: Dec. 9, 2015

(65) Prior Publication Data
US 2017/0170296 A1    Jun. 15, 2017

(51) Int. Cl.
*H01L 21/336* (2006.01)
*H01L 29/66* (2006.01)
*H01L 29/78* (2006.01)
*H01L 21/02* (2006.01)
(Continued)

(52) U.S. Cl.
CPC .... *H01L 29/66492* (2013.01); *H01L 21/0217* (2013.01); *H01L 21/02362* (2013.01); *H01L 21/02532* (2013.01); *H01L 21/02587* (2013.01); *H01L 21/02636* (2013.01); *H01L 21/31111* (2013.01); *H01L 21/31116* (2013.01); *H01L 21/324* (2013.01); *H01L 29/66636* (2013.01); *H01L 29/7833* (2013.01)

(58) Field of Classification Search
CPC ........... H01L 29/66636; H01L 29/7834; H01L 29/7848; H01L 29/6653; H01L 29/66628; H01L 29/7833; H01L 21/02057; H01L 29/4925; H01L 29/6659; H01L 29/6656; H01L 21/30604; H01L 29/1075; H01L 29/2003; H01L 29/41783; H01L 29/78621
See application file for complete search history.

(56) References Cited

U.S. PATENT DOCUMENTS 5,847,428 A * 12/1998 Fulford, Jr. ........... H01L 29/665
257/344
8,716,092 B2    5/2014 Cheng
(Continued)

*Primary Examiner* — Duy T Nguyen
(74) *Attorney, Agent, or Firm* — Winston Hsu

(57) ABSTRACT

A manufacturing method of a semiconductor structure for improving quality of an epitaxial layer is provided in the present invention. The manufacturing method includes the following steps. A gate structure is formed on a semiconductor substrate, and two lightly doped regions are formed in the semiconductor substrate at two sides of the gate structure. A capping layer is formed on the gate structure and the lightly doped regions. Two epitaxial layers are formed at the two sides of the gate structure after the step of forming the capping layer. An oxide film formed on the lightly doped regions will influence the growth condition of the epitaxial layers. A removing process is performed to remove the oxide film on the lightly doped regions before the step of forming the capping layer so as to improve the quality of the epitaxial layers.

12 Claims, 7 Drawing Sheets

(51) Int. Cl.
*H01L 21/311* (2006.01)
*H01L 21/324* (2006.01)

(56) References Cited

U.S. PATENT DOCUMENTS

| | | | | |
|---|---|---|---|---|
| 2006/0019456 A1* | 1/2006 | Bu | ............... | H01L 29/6653 438/303 |
| 2012/0094460 A1* | 4/2012 | Cheng | ............ | H01L 21/823807 438/299 |
| 2012/0252180 A1* | 10/2012 | Tomimatsu | ......... | H01L 27/1104 438/299 |
| 2013/0280878 A1* | 10/2013 | Wen | ............... | H01L 21/3105 438/299 |
| 2014/0273471 A1* | 9/2014 | Gwak | ............ | H01L 27/10852 438/702 |

* cited by examiner

US 9,741,818 B2

MANUFACTURING METHOD OF SEMICONDUCTOR STRUCTURE FOR IMPROVING QUALITY OF EPITAXIAL LAYERS

BACKGROUND OF THE INVENTION

1. Field of the Invention

The present invention relates to a manufacturing method of a semiconductor structure, and more particularly, to a manufacturing method of a semiconductor structure for improving the quality of epitaxial layers in the semiconductor structure.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as a silicon germanium (SiGe) epitaxial layer in a silicon substrate. As the lattice constant of the SiGe epitaxial layer is greater than the lattice constant of the silicon substrate thereby producing stress to the channel region of a PMOS transistor, the carrier mobility is increased in the channel region and speed of MOS transistor is improved accordingly. Conversely, a silicon carbide (SiC) epitaxial layer could be formed in silicon substrate to produce tensile stress for gate channel of an NMOS transistor.

In the procedure of forming the epitaxial layer, the growth condition of the epitaxial layer will be affected by impurities around the target area, such as a recess in the silicon substrate. The condition of defects, such as stacking faults, in the epitaxial layer will become worse, and the electrical properties of the MOS transistor may be influenced accordingly. In addition, if the impurities are unevenly distributed, the defect conditions of the epitaxial layers corresponding to different transistors will be different from one another more obviously, and the electrical characteristic uniformity of the transistors may become worse too.

SUMMARY OF THE INVENTION

According to the claimed invention, a manufacturing method of a semiconductor structure is provided. The manufacturing method includes the following steps. First of all, a semiconductor substrate is provided. A gate structure is formed on the semiconductor substrate. Two lightly doped regions are formed in the semiconductor substrate and at two sides of the gate structure respectively. A capping layer is formed on the gate structure and the lightly doped regions. Two epitaxial layers are formed at the two sides of the gate structure after the step of forming the capping layer. A removing process is performed to remove a first oxide film on the lightly doped regions before the step of forming the capping layer.

According to the manufacturing method of the semiconductor structure in the present invention, the removing process is performed before the step of forming the capping layer, and impurities on the semiconductor substrate are reduced. After the step of forming the capping layer, impurities sandwiched between the capping layer and the semiconductor substrate may be reduced accordingly. Therefore, the growth condition of the epitaxial layers subsequently formed and the condition of defects, such as stacking faults, in the epitaxial layers will be improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating the manufacturing method of the semiconductor structure according to the first embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Figure 1:
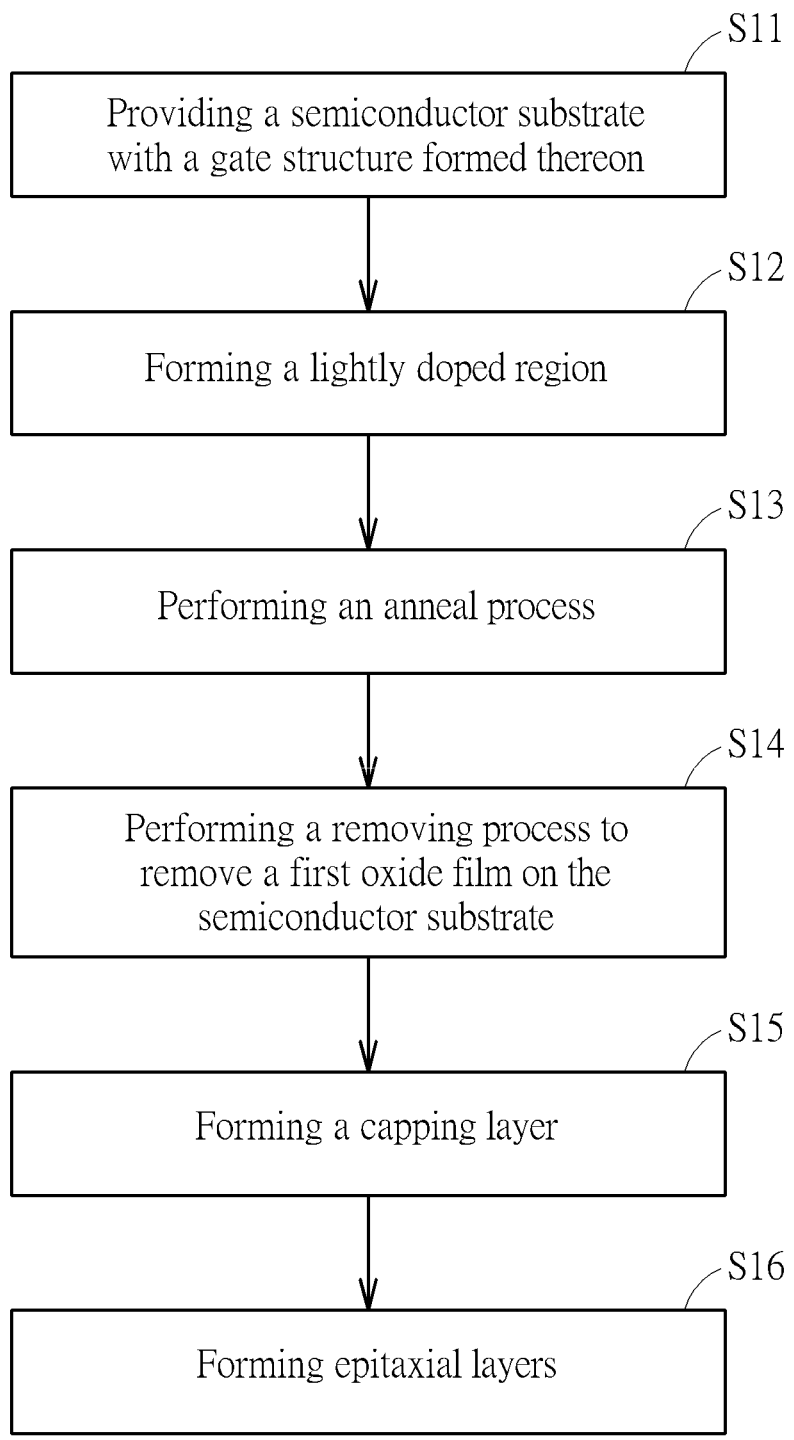
FIG. 1 is a flowchart illustrating a manufacturing method of a semiconductor structure according to a first embodiment of the present invention.
Figure 2:
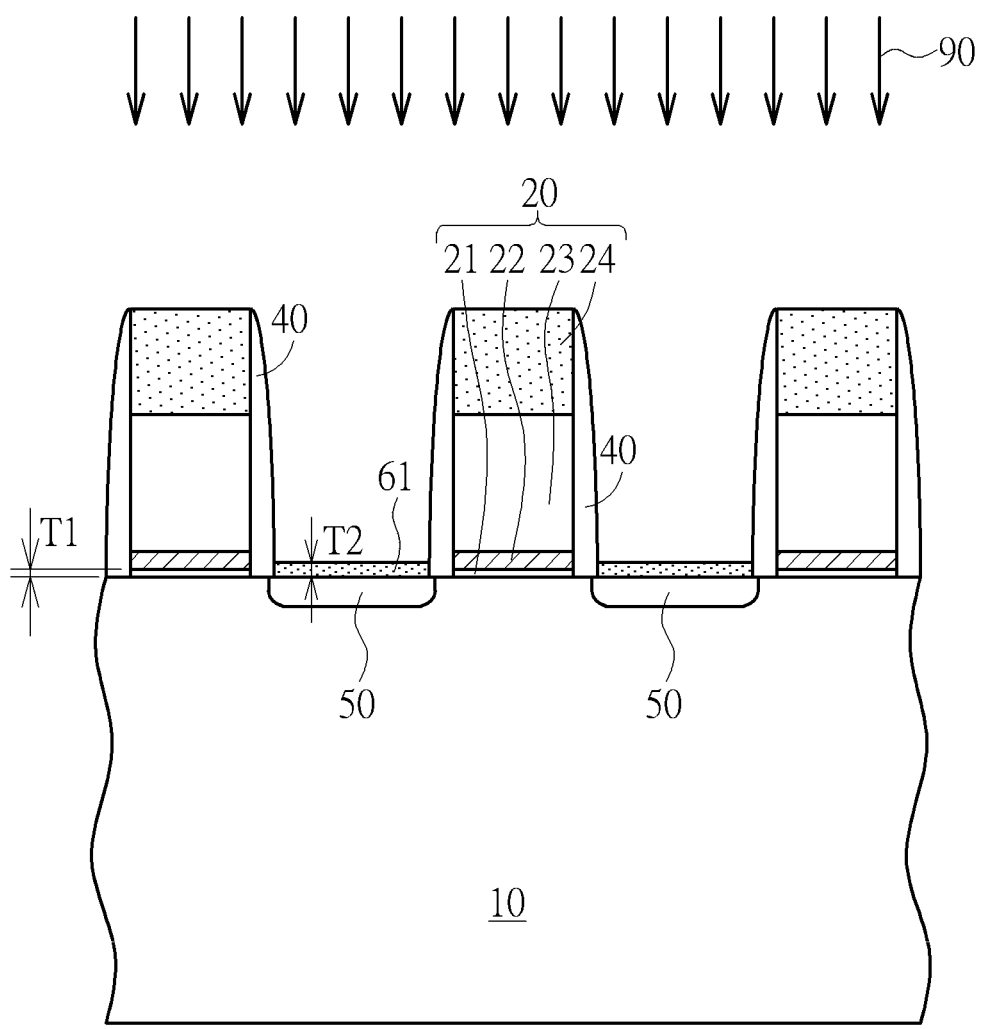

Please refer to FIGS. 1-5. FIG. 1 is a flowchart illustrating a manufacturing method of a semiconductor structure according to a first embodiment of the present invention. FIGS. 2-5 are schematic drawings illustrating the manufacturing method of the semiconductor structure in this embodiment. The manufacturing method of the semiconductor structure in this embodiment includes the following steps. As shown in FIG. 1 and FIG. 2, in step S11, a semiconductor substrate 10 is provided, and at least one gate structure 20 is formed on the semiconductor substrate 10. In this embodiment, the formation of the gate structure 20 could be accomplished by sequentially forming an interfacial layer 21, a gate dielectric layer 22, a gate material layer 23, and a hard mask layer 24 on the semiconductor substrate 10, conducting a pattern transfer process by using a patterned resist (not shown) as mask to partially remove the hard mask layer 24, the gate material layer 23, the gate dielectric layer 22, and the interfacial layer 21 through single or multiple etching processes, and stripping the patterned resist for forming at least one gate structure 20 on the semiconductor substrate 10. Therefore, each gate structure 20 is composed of the interfacial layer 21, the gate dielectric layer 22, and the gate material layer 23. The interfacial layer 21 is disposed between the gate dielectric layer 22 and the semiconductor substrate 10 in a vertical direction D2. Despite three gate structures 20 are disclosed in this embodiment, the quantity of the gate structures 20 is not limited to this.

The semiconductor substrate 10 may be a semiconductor substrate including silicon substrate, epitaxial substrate, silicon carbide substrate, or silicon-on-insulator (SOI) substrate, but not limited thereto. The interfacial layer 21 may be a silicon oxide layer, and the gate dielectric layer 22 may be composed of silicon dioxide, silicon nitride, or high dielectric constant material. The gate material layer 23 may be composed of conductive material such as metal, polysilicon, or silicide. The hard mask layer 24 may be composed of silicon dioxide, silicon nitride, silicon carbide, or silicon oxynitride, but not limited thereto. Moreover, the hard mask layer 24 may further include a first hard mask layer and a second hard mask layer, in which each of them could include silicon oxide and silicon nitride.

A plurality of doped wells (not shown) or a plurality of shallow trench isolations (STIs) may also be formed in the semiconductor substrate 10. Also, it should be noted that the fabrication process may be applied to planar type transistors or non-planar transistors such as FinFETs, and in such instance, the semiconductor substrate 10 may include a fin-shaped structure.

Subsequently, in step S12, a first spacer 40 is formed on the sidewall of each gate structure 20, and a lightly doped implantation process is performed to form at least two lightly doped regions 50 in the semiconductor substrate 10 at two sides of the gate structure 20 in a horizontal direction D1. In step S13, an anneal process such as a rapid thermal anneal process of approximately 930° C. is performed to activate the dopants implanted into the semiconductor substrate 10.

In step S14, a removing process 90 is then performed to remove a first oxide film 61 on the lightly dope regions 50. In this embodiment, the first oxide film 61 on the lightly dope regions 50 may include native oxide, a remainder of the interfacial layer 21, and/or oxide formed by the annealing process mentioned above. Therefore, the first oxide film 61 may include silicon oxide and/or other oxide. In other words, at least a part of the first oxide film 61 is formed by the annealing process performed after the lightly doped implantation process, but not limited thereto. A thickness of the interfacial layer 21 (such as a first thickness T1 shown in FIG. 2) is substantially less than a thickness of the first oxide film 61 (such as a second thickness T2 shown in FIG. 2). The first oxide film 61 may be completely removed by the removing process 90 preferably. In other words, the annealing process is performed after the step of forming the lightly doped regions 50 and before the removing process 90.

In this embodiment, the removing process 90 may include a wet etching process and/or a dry etching process. For example, the wet etching process mentioned above may include a Standard Clean 1 (SC1) process, a buffer oxide etch (BOE) process, and/or other appropriate wet etching process. The dry etching process mentioned above may include a SiCoNi etching process or other appropriate dry etching process. A etching gas used in the SiCoNi etching process includes nitrogen trifluoride ($NF_3$) and ammonia ($NH_3$). For example, in one preferred embodiment of present invention, a SiCoNi etching process is utilized with a possible change in the chemical compositions is shown as follows:

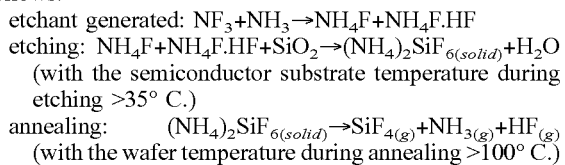

etchant generated: $NF_3 + NH_3 \rightarrow NH_4F + NH_4F \cdot HF$
etching: $NH_4F + NH_4F \cdot HF + SiO_2 \rightarrow (NH_4)_2SiF_{6(solid)} + H_2O$
  (with the semiconductor substrate temperature during etching >35° C.)
annealing: $(NH_4)_2SiF_{6(solid)} \rightarrow SiF_{4(g)} + NH_{3(g)} + HF_{(g)}$
  (with the wafer temperature during annealing >100° C.)

It is worth noting that the process conditions of the removing process 90 may be further modified to effectively remove the first oxide film 61 without damaging other components. For example, when the removing process 90 is a SC1 process, the process temperature may be around 60° C., and the process time may range between 45 seconds and 60 seconds, but not limited thereto.

Figure 3:
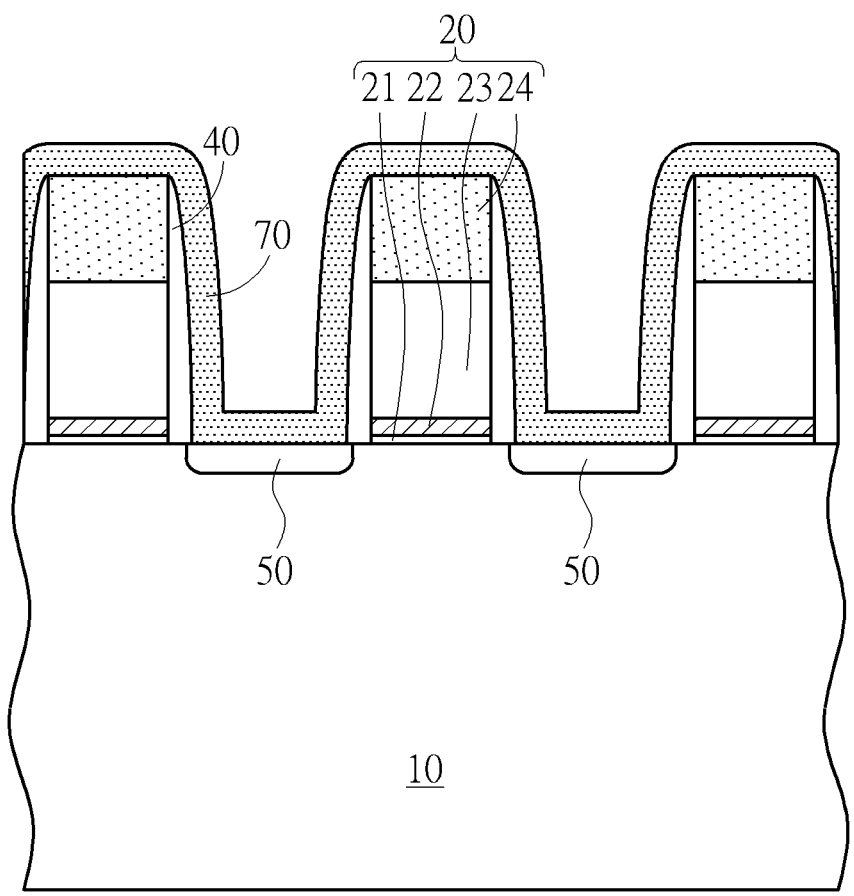

As shown in FIG. 1 and FIG. 3, in step S15, a capping layer 70 is formed on the gate structures 20 and the lightly doped regions 50. In this embodiment, the capping layer 70 may be a silicon nitride layer formed by a chemical vapor deposition process, and the capping layer 70 may be formed conformally on the hard mask layers 24, the first spacer 40, and the lightly doped regions 50, but not limited thereto. It is worth noting that because the removing process mentioned above is performed before the step of forming the capping layer 70, there should be almost no oxide remained between the capping layer 70 and the lightly doped region 50 preferably, but the present invention is not limited to this. In other embodiment of the present invention, there may be some native oxide film formed after the removing process mentioned above, and the native oxide film may remain between the capping layer and the lightly doped region 50.

Figure 4:
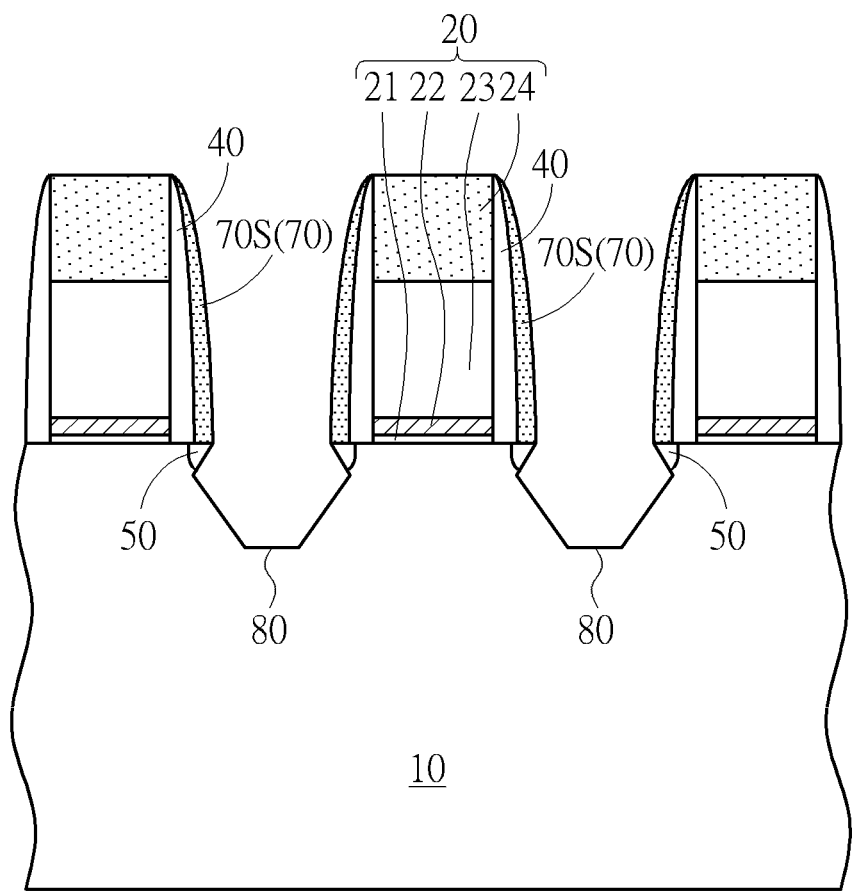

As shown in FIG. 4, an anisotropic etching process may be performed to remove a part of the capping layer 70 and form a second spacer 70S on the sidewall of the gate structure 20. The first spacer 40 and the second spacer 70S are stacked in the horizontal direction D1. Subsequently, another etching process may be conducted by using the gate structure 20, the first spacer 40, and the second spacer 70S as mask to etch the semiconductor substrate 10 along the second spacer 70S for forming two recesses 80 adjacent to the second spacer 70S and within the semiconductor substrate 10. The etching process of forming the recess 80 may include a single etching process or a multiple etching process so as to vertically etch the semiconductor substrate 10 uncovered by the gate structure 20, the first spacer 40, and the second spacer 70S and to laterally etch the semiconductor substrate 10 directly under the second spacer 70S and/or the first spacer 40 for further expanding the volume of the recess 80. The recess 80 in this embodiment may be a hexagonal shaped recess, but the present invention is not limited to this. In other embodiments of the present invention, a circular shaped recess, a diamond shaped recess, or other appropriate shapes of the recess may also be applied.

Figure 5:
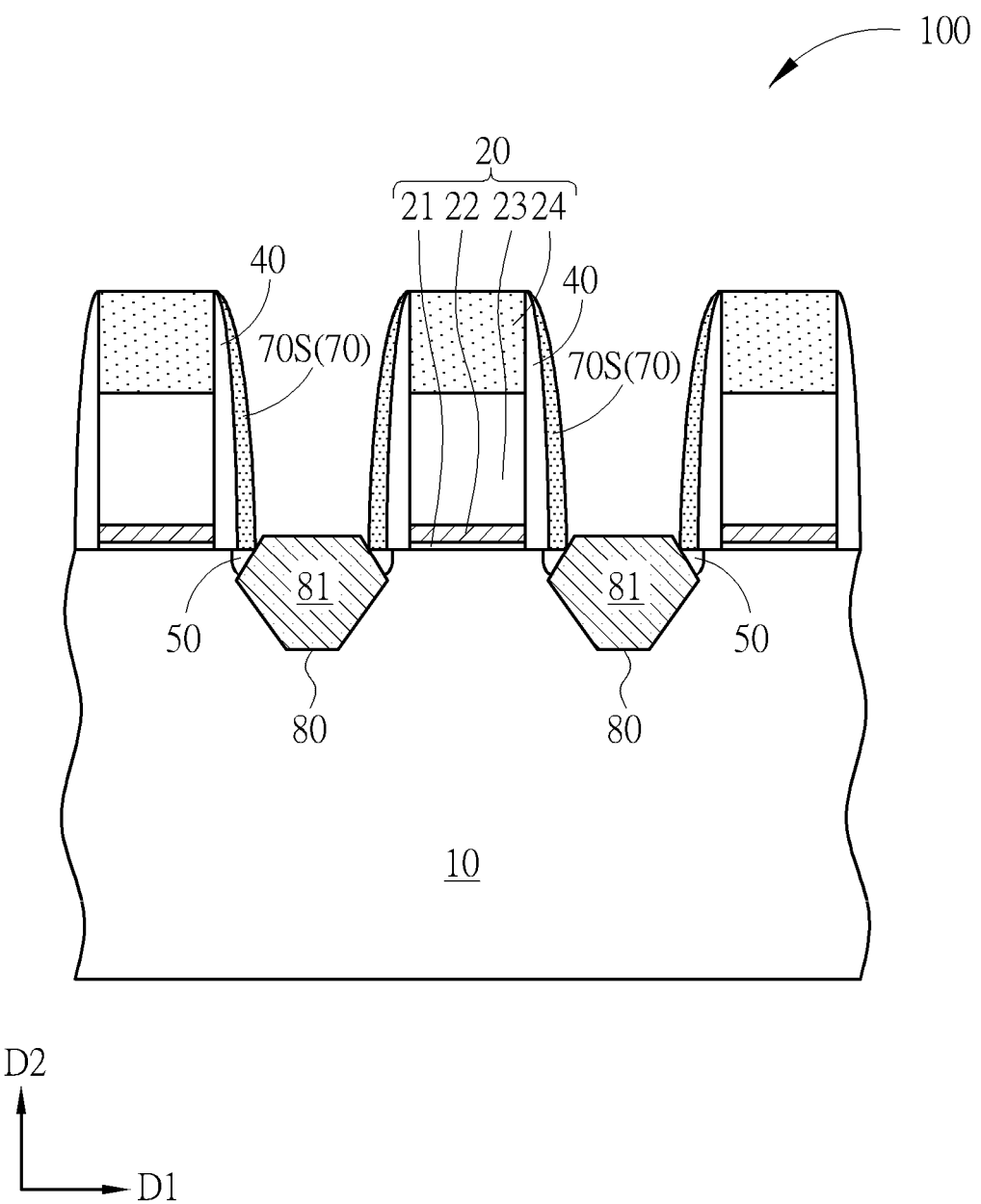

As shown in FIG. 1 and FIG. 5, two epitaxial layers 81 are then formed at the two sides of the gate structure 20. Specifically, the epitaxial layer 81 is formed in each of the two recesses 80, and the epitaxial layers 81 are formed after the step of forming the capping layer described above. In this embodiment, the epitaxial layer 81 may include a silicon germanium (SiGe) epitaxial layer, but the present invention is not limited thereto. In other embodiments of the present invention, the epitaxial layer 81 may also be composed of other suitable epitaxial materials such as silicon carbide (SiC). Additionally, a buffer layer (not shown) may be selectively formed in the recess 80 for covering the surface of the semiconductor substrate 10 within the recess 80 before the step of forming the epitaxial layer 81. The buffer layer may also include silicon germanium or other suitable materials, and the buffer layer is conformally grown on the surface of the semiconductor substrate 10 within the recess 80. After the step of forming the buffer layer, a selective epitaxial growth process is conducted to form the epitaxial layers 81. In this embodiment, the epitaxial layer 81 is hexagonal preferably, but not limited thereto. As shown in FIG. 5, a semiconductor structure 100 may then be obtained by the manufacturing process mention above.

Additionally, after the recesses 80 are formed and before the step of forming the epitaxial layers 81, a pre-clean process is selectively conducted by using cleaning agent such as diluted hydrofluoric acid or SPM containing sulfuric acid, hydrogen peroxide, and deionized water to remove native oxide or other impurities from the surface of the recess 80. If the capping layer is formed without performing the removing process before the step of forming the capping layer, the first oxide film will remain and be covered by the second spacer 70S, and the first oxide film covered by the second spacer 70S is hardly removed by the etching process of forming the second spacer, the etching process of forming the recesses 80, and/or the pre-clean process mentioned above. The first oxide film covered by the second spacer 70S will remain during the process of forming the epitaxial layer 81, the growth condition of the epitaxial layer 81 and the condition of defects, such as stacking faults, in the epitaxial layers 81 will be affected by the first oxide film covered by the second spacer 70S. In other words, the first oxide film may be removed by the removing process before the step of forming the capping layer, and the growth condition and the condition of defects in the epitaxial layers 81 may be improved accordingly.

After the semiconductor structure 100 is formed, typical transistor fabrication process could be carried out by forming a main spacer on the sidewall of each gate structure 20, and then forming a source/drain region in the semiconductor substrate 10 adjacent to two sides of the main spacer. Elements including silicide, contact etch stop layer (CESL), and interlayer dielectric (ILD) layer could be formed thereafter, and a replacement metal gate process could also be conducted to transform the gate structures 20 into metal gates. As these processes are well known to those skilled in the art, the details of which are not explained herein for the sake of brevity.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
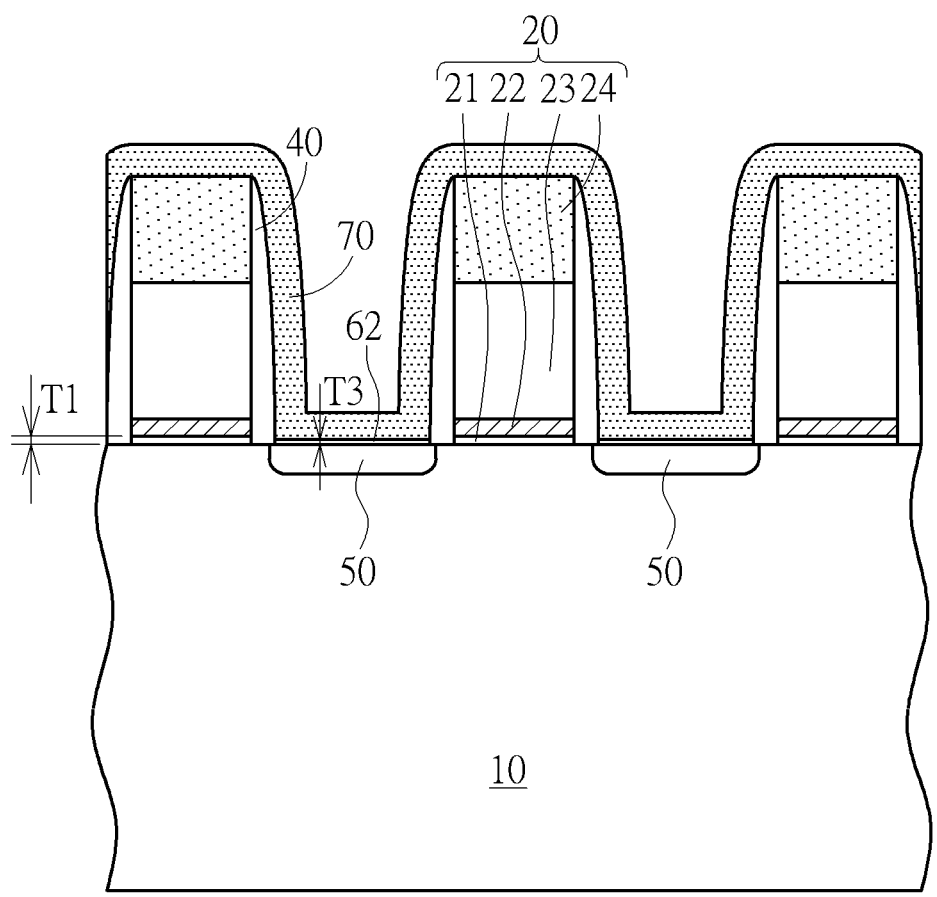
FIG. 6 is a schematic drawing illustrating a manufacturing method of a semiconductor structure according to a second embodiment of the present invention.

Please refer to FIG. 6. FIG. 6 is a schematic drawing illustrating a manufacturing method of a semiconductor structure according to a second embodiment of the present invention. As shown in FIG. 6, the difference between the manufacturing method of this embodiment and the manufacturing method of the above-mentioned first embodiment is that a second oxide film 62 may be formed between the capping layer 70 and the lightly doped region 50. The second oxide film 62 may include a native oxide film formed after the removing process mentioned above and/or a residue of the first oxide film after the removing process. Therefore, a thickness of the interfacial layer 21 (such as the first thickness T1 shown in FIG. 6) is larger than a thickness of the second oxide film 62 (such as a third thickness T3 shown in FIG. 6) formed between the capping layer 70 and the lightly doped region 50. Because the second oxide film 62 is extremely thin (about less than 16 angstroms), the influence of the epitaxial layer subsequently formed will be reduced accordingly.

Figure 7:
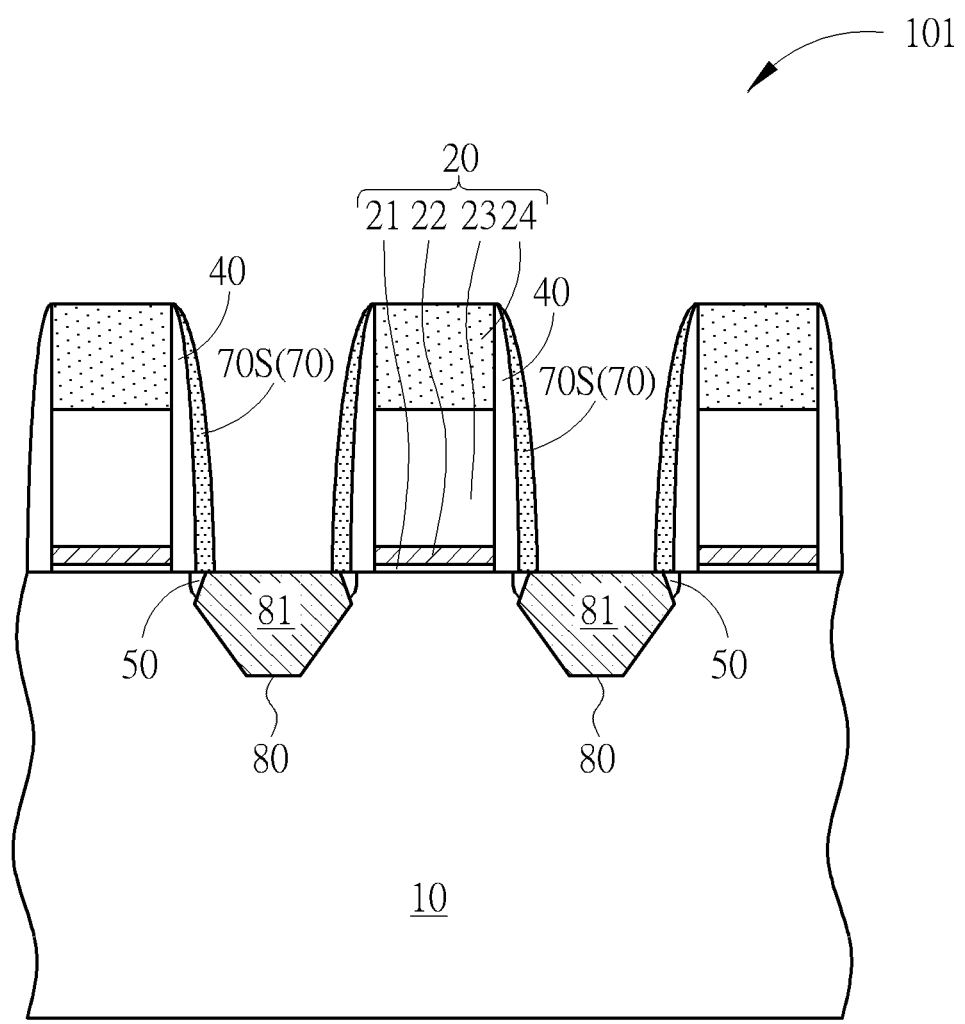
FIG. 7 is a schematic drawing illustrating a manufacturing method of a semiconductor structure according to a third embodiment of the present invention.

Please refer to FIG. 7. FIG. 7 is a schematic drawing illustrating a manufacturing method of a semiconductor structure 101 according to a third embodiment of the present invention. As shown in FIG. 7, the difference between the manufacturing method of this embodiment and the manufacturing method of the above-mentioned first embodiment is that in the step of forming the recess 80 in this embodiment, the semiconductor substrate 10 directly under the second spacer 70S is further removed by the laterally etching process and the opening of the recess 80 may be overlapped by the second spacer 70S. Therefore, the epitaxial layers 81 subsequently formed in the recess 80 may contact the bottom surface of the second spacer 70S, and the growth condition of the epitaxial layers 81 influenced by the impurities and/or the oxide layer under the second spacer 70S because the removing process is performed before the step of forming the capping layer 70 to remove the impurities and/or the oxide layer.

To summarize the above descriptions, in the manufacturing method of the semiconductor structure of the present invention, the removing process is performed to remove the first oxide film before the step of forming the capping layer. After the step of forming the capping layer, impurities sandwiched between the capping layer and the semiconductor substrate may be reduced accordingly. Therefore, the growth condition of the epitaxial layers subsequently formed and the condition of defects, such as stacking faults, in the epitaxial layers will be improved. In addition, the electrical characteristic uniformity of the semiconductor structures may also be improved because the qualities of the epitaxial layers become more stable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor structure, comprising:
providing a semiconductor substrate, wherein a gate structure is formed on the semiconductor substrate, and a first spacer is formed on the sidewall of the gate structure;
forming two lightly doped regions in the semiconductor substrate at two sides of the gate structure;
forming a first oxide film on the lightly doped regions, wherein the first oxide film is formed on the lightly doped regions and the first spacer only;
forming a capping layer on the gate structure and the lightly doped regions;
forming two epitaxial layers at the two sides of the gate structure after the step of forming the capping layer; and
performing a removing process to remove the first oxide film on the lightly doped regions before the step of forming the capping layer, wherein the step of forming the epitaxial layers comprises:
removing a part of the capping layer to form a second spacer on the sidewall of the gate structure, wherein the capping layer is a silicon nitride layer, and the second spacer is a silicon nitride spacer;
forming two recesses adjacent to the second spacer and within the semiconductor substrate; and
forming the epitaxial layer in each of the two recesses, wherein the second spacer is composed of the capping layer, and the epitaxial layers formed in the recesses directly contact the second spacer.

2. The manufacturing method of claim 1, wherein the removing process comprises a wet etching process or a dry etching process.

3. The manufacturing method of claim 2, wherein the wet etching process comprises a Standard Clean 1 (SC1) process and/or a buffer oxide etch (BOE) process.

4. The manufacturing method of claim 2, wherein the dry etching process comprises a SiCoNi etching process, and a process gas used in the SiCoNi etching process comprises nitrogen trifluoride ($NF_3$) and ammonia ($NH_3$).

5. The manufacturing method of claim 1, wherein the gate structure comprises a gate dielectric layer and an interfacial layer, the interfacial layer is disposed between the gate dielectric layer and the semiconductor substrate, and a thickness of the interfacial layer is less than a thickness of the first oxide film.

6. The manufacturing method of claim 1, further comprising performing an annealing process after the step of forming the lightly doped regions and before the removing process.

7. The manufacturing method of claim 6, wherein at least a part of the first oxide film is formed by the annealing process.

8. The manufacturing method of claim 1, wherein the gate structure comprises a gate dielectric layer and an interfacial layer, and the interfacial layer is disposed between the gate dielectric layer and the semiconductor substrate, wherein a thickness of the interfacial layer is larger than a thickness of a second oxide film formed between the capping layer and the lightly doped region.

9. The manufacturing method of claim 8, wherein the second oxide film is a native oxide film formed after the removing process.

10. The manufacturing method of claim 1, wherein the step of forming the epitaxial layers comprises a selective epitaxial growth process.

11. The manufacturing method of claim 1, wherein the epitaxial layer comprises a silicon germanium (SiGe) epitaxial layer.

12. The manufacturing method of claim 1, wherein the epitaxial layer is hexagonal.

* * * * *